(12) United States Patent
Toguchi et al.

(10) Patent No.: US 6,660,408 B1
(45) Date of Patent: *Dec. 9, 2003

(54) ORGANIC ELECTROLUMINESCENT DEVICE

(75) Inventors: Satoru Toguchi, Tokyo (JP); Hitoshi Ishikawa, Tokyo (JP); Atsushi Oda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/315,345

(22) Filed: May 20, 1999

(30) Foreign Application Priority Data

May 22, 1998 (JP) ............................................ 10-141492

(51) Int. Cl.[7] .............................................. H05B 33/12
(52) U.S. Cl. ..................... 428/690; 428/917; 313/504; 313/506
(58) Field of Search ................................ 428/690, 704, 428/917; 313/504, 506; 257/40, 103

(56) References Cited

U.S. PATENT DOCUMENTS

| | | | | |
|---|---|---|---|---|
| 5,635,308 A | * | 6/1997 | Inoue et al. ................ | 428/690 |
| 5,759,444 A | * | 6/1998 | Enokida et al. ........ | 252/301.16 |
| 5,935,721 A | * | 8/1999 | Shi et al. .................... | 428/690 |

FOREIGN PATENT DOCUMENTS

| | | |
|---|---|---|
| JP | 54-71295 | 6/1979 |
| JP | 3-200889 | 9/1991 |
| JP | 7-138561 | 5/1995 |
| JP | 8-12600 | 1/1996 |
| JP | 8-20771 | 1/1996 |
| JP | 8-40995 | 2/1996 |
| JP | 8-40997 | 2/1996 |
| JP | 8-53397 | 2/1996 |
| JP | 8-87122 | 4/1996 |
| JP | 8-239655 | 9/1996 |
| JP | 8-333569 | 12/1996 |
| JP | 9-255948 | 9/1997 |
| JP | 10-251633 | 9/1998 |
| JP | 10-330295 | 12/1998 |
| JP | 11-111460 | 4/1999 |
| JP | 11-228951 | 8/1999 |

OTHER PUBLICATIONS

C. W. Tang et al., "Organic electroluminescent diodes", *Appl. Phys. Lett.*, vol. 51, No. 12, Sep. 21, 1987, pp. 913–915.

* cited by examiner

*Primary Examiner*—Marie Yamnitzky
(74) *Attorney, Agent, or Firm*—Sughrue Mion, PLLC

(57) ABSTRACT

An organic EL device which comprises an anode, a cathode and one or more than one organic thin-film layer including a light-emitting layer contains a specific diaryl compound, triaryl compound or tetraaryl compound represented by following formula (1), (2) or (3):

$$Ar^1—Ar^{1'} \quad (1)$$

$$Ar^1—Ar^3—Ar^2 \quad (2)$$

$$Ar^1—Ar^3—Ar^4—Ar^2 \quad (3)$$

wherein $Ar^1$, $Ar^{1'}$ and $Ar^2$ is, for example, a monovalent group represented by formula (4), and $Ar^3$ and $Ar^4$ is, for example, a divalent group represented by formula (7):

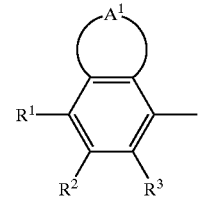

(4)

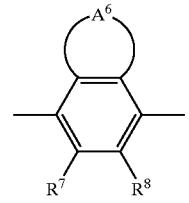

(7)

wherein $A^1$ and $A^6$ represent an atomic group forming a substituted or unsubstituted condensed hydrocarbon ring or heterocyclic ring, and $R^1$–$R^3$ and $R^7$–$R^8$ represent, for example, a hydrogen atom, halogen atom, or substituted or unsubstituted aromatic hydrocarbon group.

5 Claims, 1 Drawing Sheet

ORGANIC ELECTROLUMINESCENT DEVICE

CROSS REFERENCE TO RELATED APPLICATIONS

The present invention claims priority from Japanese Patent Application No. 10-141492 filed May 22, 1998, the contents of which are incorporated herein by reference.

BACKGROUND OF THE INVENTION

1. Field of the Invention

The present invention relates to an organic electroluminescent device having excellent light-emitting properties.

2. Description of Related Art

An organic electroluminescent device (which will hereinafter be called "organic EL device) is a light-emitting device which makes use of the principle that when an electric field is applied, a fluorescent material emits light in response to the charge recombination of holes injected from an anode and electrons injected from a cathode. After C. W. Tang et al. of Eastman Kodak Company reported a low-voltage-driven organic EL device using a double layered structure (C. W. Tang, S. A. Vanslyke, Applied Physics Letters, Vol. 51, 913 (1987) and the like), studies on an organic EL device have been briskly carried out. Tang et al. reported an organic EL device using tris(8-hydroxyquinolinol aluminum) in a light-emitting layer and a triphenyldiamine derivative in a hole-transporting layer. This stacked structure gives such advantages as an improvement in the injection efficiency of holes into the light-emitting layer; blocking of electrons injected from a cathode, which increase the efficiency of exciton production from charge recombination; and confinement of the excitons into the light-emitting layer. A double layered structure composed of a hole-injecting and transporting layer and an electron-transporting and light-emitting layer or a triple layered structure composed of a hole-injecting and transporting layer, a light-emitting layer and an electron-injecting and transporting layer is well known as an organic EL device. In order to increase the recombination efficiency of injected holes and electrons, various improvements in the device structure or fabrication process have been introduced to such multi-layered devices.

As a hole transport material, aromatic diamine derivatives such as N,N'-diphenyl-N,N'-bis(3-methylphenyl)-[1,1'-biphenyl]-4,4'-diamine are well known(for example, Patent Publications JP-A-8-20771, JP-A-8-40995, JP-A-8-40997, JP-A-8-53397, and JP-A-8-87122).

As an electron transporting material, oxadiazole derivatives, triazole derivatives and the like are well known.

As a light-emitting material, known are chelate complexes such as tris(8-quinolinolate)aluminum complex, coumarin derivatives, tetraphenylbutadiene derivatives, bis-styrylarylene derivatives, oxadiazole derivatives and the like. Since various color light in a visible region from blue to red are obtained from these light-emitting materials, there is increased expectation for industrialization of a full color organic EL device (refer to, e.g., JP-A-8-239655, JP-A-7-138561, and JP-A-3-200889).

In recent days, organic EL devices with high brightness and long lifetime have been disclosed or reported, but any of them are not enough in these properties.

SUMMARY OF THE INVENTION

An object of the present invention is to provide a material of high performance and to provide an organic EL device having high luminance.

The present inventors have repeated experiments. As a result, they have found that an organic EL device having superior emission properties is obtained by using a specific diaryl, triaryl or tetra aryl compound which is substituted by diarylamino groups as a light-emitting material. They have found that said compound has high carrier transporting properties and an organic EL device having superior emission properties is obtained by using said compound as a hole-transporting material or electron-transporting material. They have found that an organic EL device having superior emission properties is obtained by using a mixture of said compound and another hole or electron-transporting material. They have found that an organic EL device having superior emission properties is obtained by using said diarylamino substituted compound which is substituted by styryl groups as an light-emitting material, hole-transporting material or electron-transporting material.

In the present invention, there is thus provided an organic EL device defined as follows:

(a) An organic EL device comprising an anode, a cathode and one or more than one organic thin-film layers including a light-emitting layer between said anode and said cathode, wherein at least one of said organic thin-film layers contains, either singly or as a mixture, a compound represented by the following formulas (1), (2) or (3):

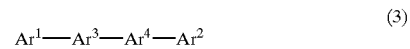

wherein $Ar^1$, $Ar^{1'}$ and $Ar^2$ each represents any groups represented by following formulas (4), (5) and (6), and wherein $Ar^1$ and $Ar^{1'}$ are different from each other,

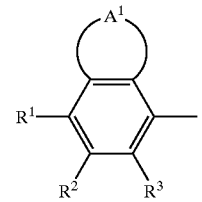

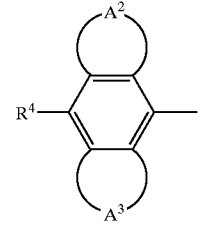

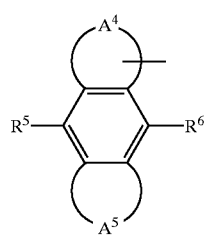

wherein Ar³ and Ar⁴ each independently represents divalent group represented by following formulas (7) to (11),

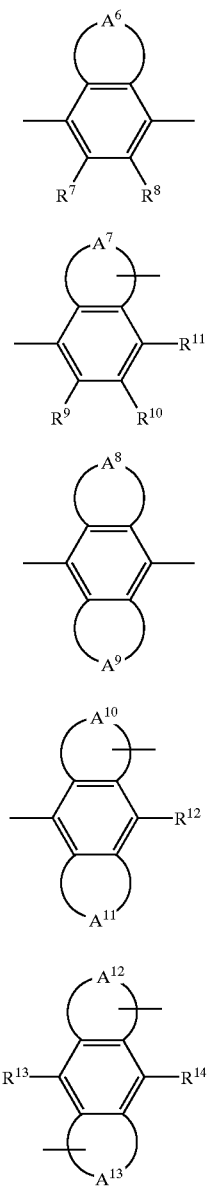

wherein $R^1$ to $R^{14}$ represent each independently a hydrogen atom, a halogen atom, a nitro group, a cyano group, a substituted or unsubstituted alkyl group, a substituted or unsubstituted alkenyl group excluding a substituted or unsubstituted styryl group, a substituted or unsubstituted aromatic hydrocarbon group, a substituted or unsubstituted aromatic heterocyclic group, a substituted or unsubstituted amino group, a substituted or unsubstituted alkoxy group, a substituted or unsubstituted aryloxy group, a substituted or unsubstituted alkoxycarbonyl group or a carboxyl group; and each pair of two of $R^1$ to $R^3$, $R^5$–$R^6$, $R^7$–$R^8$, $R^9$–$R^{10}$, and $R^{13}$–$R^{14}$ may form a ring. $A^1$ to $A^{13}$ represent an atomic group forming a substituted or unsubstituted condensed hydrocarbon ring, or a substituted or unsubstituted condensed heterocyclic ring. At least one among the substitutive groups $R^1$ to $R^{14}$ or ones existing in the ring structures represented by $A^1$ to $A^{13}$ is diarylamino group represented as —$NAr^5Ar^6$ ($Ar^5$ and $Ar^6$ each independently represents a substituted or unsubstituted aryl group having 6–20 carbon atoms (The carbon atoms of substituent groups are not counted.);

(b) An organic EL device defined in (a), wherein the organic thin-film layer includes at least a light-emitting layer which contains, either singly or as a mixture, a said compound;

(c) An organic EL device defined in (a), wherein the organic thin-film layer includes at least a hole-transporting layer which contains, either singly or as a mixture, a said compound;

(d) An organic EL device defined in (a), wherein the organic thin-film layer includes at least a electron-transporting layer which contains, either singly or as a mixture, a said compound;

(e) An organic EL device defined in (a), wherein the organic thin-film layer which contains, either singly or as a mixture, a said compound, and wherein the compound is such that at least one of $Ar^5$ and $Ar^6$ has a substituted or unsubstituted styryl group as a substituent group;

(f) An organic EL device defined in (e), wherein the organic thin-film layer includes at least a light-emitting layer which contains, either singly or as a mixture, a said compound;

(g) An organic EL device defined in (e), wherein the organic thin-film layer includes at least a hole-transporting layer which contains, either singly or as a mixture, a said compound; and (h) An organic EL device defined in (c), wherein the organic thin-film layer includes at least a electron-transporting layer which contains, either singly or as a mixture, a said compound.

The EL device according to the present invention emits light with higher brightness compared with the conventional organic EL device.

DETAILED DESCRIPTION OF THE PREFERRED EMBODIMENTS

Figure 1:
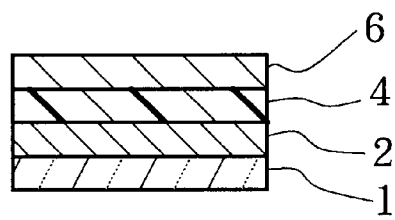
FIG. 1 is a sectional view of an organic EL device of this invention.

An organic electroluminescent device of this invention includes a compound whose structure is represented by one of formulas (1), (2) and (3). $R^1$ to $R^{14}$ each independently represents a hydrogen atom, a halogen atom, a nitro group, a cyano group, a substituted or unsubstituted alkyl group, a substituted or unsubstituted alkenyl group excluding a substituted or unsubstituted styryl group, a substituted or unsubstituted aromatic hydrocarbon group, a substituted or unsubstituted aromatic heterocyclic group, a substituted or unsubstituted amino group, a substituted or unsubstituted alkoxy group, a substituted or unsubstituted aryloxy group, a substituted or unsubstituted alkoxycarbonyl group or a carboxyl group; and each pair of two of $R^1$ to $R^3$, $R^5$–$R^6$, $R^7$–$R^8$, $R^9$–$R^{10}$, and $R^{13}$–$R^{14}$ may form a ring. $A^1$ to $A^{13}$ represent an atomic group forming a substituted or unsubstituted condensed hydrocarbon ring, or a substituted or unsubstituted condensed heterocyclic ring.

A ring structure formed by $A^1$ to $A^{13}$ may have a substituent such as a halogen atom, a nitro group, a cyano group, a substituted or unsubstituted alkyl group, a substituted or unsubstituted alkenyl group excluding a substituted or unsubstituted styryl group, a substituted or unsubstituted aromatic hydrocarbon group, a substituted or unsubstituted aromatic heterocyclic group, a substituted or unsubstituted amino group, a substituted or unsubstituted alkoxy group, a substituted or unsubstituted aryloxy group, a substituted or unsubstituted alkoxycarbonyl group or a carboxyl group. Any two substituents of a ring structure formed by $A^1$ to $A^{13}$ may form a ring.

Examples of above substitutive groups will be mentioned below. Examples of the halogen atom include fluorine, chlorine, bromine, and iodine.

The substituted or unsubstituted amino group is expressed by —$NX^1 X^2$, wherein each of $X^1$ and $X^2$ independently represents a hydrogen atom, methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo t-butyl group, 1,2,3-tribromopropyl group, iodomethyl group, 1-iodoethyl group, 2-iodoethyl group, 2-iodoisobutyl group, 1,2-diiodoethyl group, 1,3-diiodopropyl group, 2,3-diiodo t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro t-butyl group, 1,2,3-trinitropropyl group, phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 4-styrylphenyl group, 1-pyrenyl group, 2-pyrenyl group, 4-pyrenyl group, 2-biphenylil group, 3-biphenylil group, 4-biphenylil group, p-terphenylil group, p-terphenyl-4-il group, p-terphenyl-3-il group, p-terphenyl-2-il group, m-terphenyl-4-il group, m-terphenyl-3-il group, m-terphenyl-2-il-group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylil group, 4"-t-butyl-p-terphenyl-4-il group, 2-pyrrolyl group, pyrazinyl group, 2-pyrazinyl group, 2-pyridinyl group, 3-pyrridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxanlinyl group, 1-carbazolyl group, 2-carbozolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenathroline-2-il group, 1,7-phenanthroline-3-il group, 1,7-phenanthroline-4-il group, 1,7-phenanthroline-5-il group, 1,7-phenanthroline-6-il group, 1,7-phenanthroline-8-il group, 1,7-phenanthroline-9-il group, 1,7-phenanthroline-10-il group, 1,8-phenanthroline-2-il group, 1,8-phenanthroline-3-il group, 1,8-phenanthroline-4-il group, 1,8-phenanthroline-5-il group, 1,8-phenanthroline-6-il group, 1,8-phenanthroline-7-il group, 1,8-phenanthroline-9-il group, 1,8-phenanthroline-10-il group, 1,9-phenanthroline-2-il group, 1,9-phenanthroline-3-il group, 1,9-phenanthroline-4-il group, 1,9-phenanthroline-5-il group, 1,9-phenanthroline-6-il group, 1,9-phenanthroline-7-il group, 1,9-phenanthroline-8-il group, 1,9-phenanthroline-10-il group, 1,10-phenanthroline-2-il group, 1,10-phenanthroline-3-il group, 1,10-phenanthroline-4-il group, 1,10-phenanthroline-5-il group, 2,9-phenanthroline-1-il group, 2,9-phenanthroline-3-il group, 2,9-phenanthroline-4-il group, 2,9-phenanthroline-5-il group, 2,9-phenanthroline-6-il group, 2,9-phenanthroline-7-il group, 2,9-phenanthroline-8-il group, 2,9-phenanthroline-10-il group, 2,8-phenanthroline-1-il group, 2,8-phenanthroline-3-il group, 2,8-phenanthroline-4-il group, 2,8-phenanthroline-5-il group, 2,8-phenanthroline-6-il group, 2,8-phenanthroline-7-il group, 2,8-phenanthroline-9-il group, 2,8-phenanthroline-10-il group, 2,7-phenanthroline-1-il group, 2,7-phenanthroline-3-il group, 2,7-phenanthroline-4-il group, 2,7-phenanthroline-5-il group, 2,7-phenanthroline-6-il group, 2,7-phenanthroline-8-il group, 2,7-phenanthroline-9-il group, 2,7-phenanthroline-10-il group, 1-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-furazanyl, 2-thienyl group, 3-thienyl group, 2-methylpyrrol-1-il group, 2-methylpyrrol-3-il group, 2-methylpyrrol-4-il group, 2-methylpyrrol-5-il group, 3-methylpyrrol-1-il group, 3-methylpyrrol-2-il group, 3-methylpyrrol-4-il group, 3-methylpyrrol-5-il group, 2-t-butylpyrrol-4-il group, 3-(2-phenylpropyl)pyrrol-1-il group, 2-methyl-1-indolyl group, 4-methyl-1-indolyl group, 2-methyl-3-indolyl group, 4-methyl-3-indolyl group, 2-t-butyl-1-indolyl group, 4-t-butyl 1-indolyl group, 2-t-butyl 3-indolyl group, and 4-t-butyl 3-indolyl group.

Examples of the substituted or unsubstituted alkyl group include a methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydoxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino t-butyl group, 1,2,3-triaminopropyl group, cyanomethyl group, 1-cyanoethyl group, 2-cyanoethyl group, 2-cyanoisobutyl group, 1,2-dicyanothyl group, 1,3-dicyanoisopropyl group, 2,3-dicyano t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro t-butyl group, and 1,2,3-trinitropropyl group.

Examples of the substituted or unsubstituted alkenyl group include a vinyl group, allyl group, 1-butenyl group, 2-butenyl group, 3-butenyl group, 1,3-butadienyl group, 1-methylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl-1-butenyl group, and 3-phenyl-1-butenyl group.

Examples of the substituted or unsubstituted cycloalkyl group include a cyclopropyl group, cyclobutyl group, cyclopentyl group, cyclohexyl group, and 4-methylcyclohexyl group.

The substituted or unsubstituted alkoxy group is expressed by —OY$^1$, wherein Y$^1$ represents a methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromomethyl group, 2-bromoethyl group, 2-bromoisobutyl group, 1,2-dibromoethyl group, 1,3-dibromoisopropyl group, 2,3-dibromo t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, and 2,3-dinitro t-butyl group, 1,2,3-trinitropropyl group.

Examples of the substituted or unsubstituted aromatic hydrocarbon group include a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylil group, 3-biphenylil group, 4-biphenylil group, p-terphenyl-4-il group, p-terphenyl-3-il group, p-terphenyl-2-il group, m-terphenyl-4-il group, m-terphenyl-3-il group, m-terphenyl-2-il group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylil group, and 4"-t-butyl-p-terphenyl-4-il group.

Examples of the substituted or unsubstituted aromatic heterocyclic group include a 1-pyrrolyl group, 2-pyrrolyl group, 3-pyrrolyl group, pyrazinyl group, 2-pyridinyl group, 3-pyridinyl group, 4-pyridinyl group, 4-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acrydinyl group, 4-acridinyl group, 9-acridinyl group, 1,7-phenanthroline-2-il group, 1,7-phenanthroline-3-il group, 1,7-phenanthroline-4-il group, 1,7-phenanthroline-5-il group, 1,7-phenanthroline-6-il group, 1,7-phenanthroline-8-il group, 1,7-phenanthroline-9-il group, 1,7-phananthroline-10-il group, 1,8-phenanthroline-2-il group, 1,8-phenanthroline-3-il group, 1,8-phenanthroline-4-il group, 1,8-phenanthroline-5-il group, 1,8-phenanthroline-6-il group, 1,8-phenanthroline-7-il group, 1,8-phenanthroline-9-il group, 1,8-phenanthroline-10-il group, 1,9-phenanthroline-2-il group, 1,9-phenanthroline-3-il group, 1,9-phenanthroline-4-il group, 1,9-phenanthroline-5-il group, 1,9-phenanthroline-6-il group, 1,9-phenanthroline-7-il group, 1,9-phenanthroline-8-il group, 1,9-phenanthroline-10-il group, 1,10-phenanthroline-2-il group, 1,10-phenanthroline-3-il group, 1,10-phenanthroline-4-il group, 1,10-phenanthroline- 5-il group, 2,9-phenanthroline-1-il group, 2,9-phenanthroline-3-il group, 2,9-phenanthroline-4-il group, 2,9-phenanthroline-5-il group, 2,9-phenanthroline-6-il group, 2,9-phenanthroline-7-il group, 2,9-phenanthroline-8-il group, 2,9-phenanthroline-10-il group, 2,8-phenanthroline-1-il group, 2,8-phenanthroline-3-il group, 2,8-phenanthroline-4-il group, 2,8-phenanthroline-5-il group, 2,8-phanenathroline-6-il group, 2,8-phenanthroline-7-il group, 2,8-phenanthroline-9-il group, 2,8-phenanthroline-10-il group, 2,7-phenanthroline-1-il group, 2,7-phenanthroline-3-il group, 2,7-phenanthroline-4-il group, 2,7-phenanthroline-5-il group, 2,7-phenanthroline-6-il group, 2,7-phenanthroline-8-il group, 2,7-phenanthroline-9-il group, 2,7-phenanthroline-10-il group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-il group, 2-methylpyrrol-3-il group, 2-methylpyrrol-4-il group, 2-methylpyrrol-5-il group, 3-methylpyrrol-1-il group, 3-methylpyrrol-2-il group, 3-methylpyrrol-4-il group, 3-methylpyrrol-5-il group, 2-t-butylpyrrol-4-il group, 3-(2-phenylpropyl)pyrrol-1-il group, 2-methyl-1-indolyl group, 4-methyl-1-indolyl group, 2-methyl-3-indolyl group, 4-methyl-3-indolyl group, 2-t-butyl 1-indolyl group, 4-t-butyl 1-indolyl group, 2-t-butyl 3-indolyl group, and 4-t-butyl 3-indolyl group.

Examples of the substituted or unsubstituted aralkyl group include a benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, 2-β-naphthylisopropyl group, 1-pyrrolylmethyl group, 2-(1-pyrrolyl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, and 1-chloro-2-phenylisopropyl group.

The substituted or unsubstituted aryloxy group is represented by —OZ, wherein Z represents a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylil group, 3-biphenylil group, 4-biphenylil group, p-terphenyl-4-il group, p-terphenyl-3-il group, p-terphenyl-2-il group, m-terphenyl-4-il group, m-terphenyl-3-il group, m-terphenyl-2-il group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylil group, 4"-t-butyl-p-terphenyl-4-il group, 2-pyrrolyl group, 3-pyrrolyl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbozolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl, group, 4-acridinyl group, 9-acridinyl group, 1,7-phenanthroline-2-il group, 1,7-phenanthroline-3-il group, 1,7-phenanthroline-4-il group, 1,7-phenanthroline-5-il group, 1,7-phenanthroline-6-il group, 1,7-phenanthroline-8-il group, 1,7-phenanthroline-9-il group, 1,7-phenanthroline-10-il group, 1,8-phenanthroline-2-il group, 1,8-phenanthroline-3-il group, 1,8-phenanthroline-4-il group, 1,8-phenanthroline-5-il group, 1,8-phenanthroline-6-il group, 1,8-phenanthroline-7-il group, 1,8-phenanthroline-9-il group, 1,8-phenanthroline-10-il group, 1,9-phenanthroline-2-il group, 1,9-phenanthroline-3-il group, 1,9-phenanthroline-4-il group, 1,9-phenanthroline-5-il group, 1,9-phenanthroline-6-il group, 1,9-phenanthroline-7-il group, 1,9-phenanthroline-8-il group, 1,9-phenanthroline-10-il group, 1,10-phenanthroline-2-il group, 1,10-phenanthroline-3-il group, 1,10-phenanthroline-4-il group, 1,10-phenanthroline-5-il group, 2,9-phenanthroline-1-il group, 2,9-phenanthroline-3-il group, 2,9-phenanthroline-4-il group, 2,9-phenanthroline-5-il group, 2,9-phenanthroline-6-il group, 2,9-phenanthroline-7-il group, 2,9-phenanthroline-8-il group, 2,9-phenanthroline-10-il group, 2,8-10 phenanthroline-1-il group, 2,8-phenanthroline-3-il group, 2,8-phenanthroline-4-il group, 2,8-phenanthroline-5-il group, 2,8-phanenathroline-6-il group, 2,8-phenanthroline-7-il group, 2,8-phenanthroline-9-il group, 2,8-phenanthroline-10-il group, 2,7-phenanthroline-1-il group, 2,7-phenanthroline-3-il group, 2,7-phenanthroline-4-il group, 2,7-phenanthroline-5-il group, 2,7-phenanthroline-6-il group, 2,7-phenanthroline-8-il group, 2,7-phenanthroline-9-il group, 2,7-phenanthroline-10-il group, 1-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-il group, 2-methylpyrrol-3-il group, 2-methylpyrrol-4-il group 2-methylpyrrol-5-il group, 3-methylpyrrol-1-il group, 3-methylpyrrol-2-il group, 3-methylpyrrol-4-il group, 3-methylpyrrol-5-il group, 2-t-butylpyrrol-4-il group, 3-(2-phenylpropyl)pyrrol-1-il group, 2-methyl-1-indolyl group, 4-methyl-1-indolyl group, 2-methyl-3-indolyl group, 4-methyl-3-indolyl group, 2-t-butyl-1-indolyl group, 4-t-butyl 1-indolyl group, 2-t-butyl 3-indolyl group, and 4-t-butyl 3-indolyl group.

The substituted or unsubstituted alkoxycarbonyl group is expressed by —COOY$^2$, wherein Y$^2$ represents a methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromomethyl group, 2-bromoethyl group, 2-bromoisobutyl group, 1,2-dibromoethyl group, 1,3-dibromoisopropyl group, 2,3-dibromo t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro t-butyl group, and 1,2,3-trinitropropyl group.

Examples of the divalent group forming a ring include a tetramethylene group, pentamethylene group, hexamethylene group, diphenylmethane-2,2'-diyl group, diphenylethane-3,3'-diyl group, and diphenylpropane-4,4'-diyl group.

The diaryl amino group is expressed by —NAr$^5$Ar$^6$ (wherein Ar$^5$ and Ar$^6$ each independently represents a substituted or unsubstituted aryl group having 6–20 carbon atoms). Examples of the aryl group having 6–20 carbon atoms include a phenyl group, naphthyl group, anthryl group, phenanthryl group, naphtacenyl group, and pyrenyl group. Examples of the substituent of the aryl group include a said halogen atom, hydroxyl group, said substituted or unsubstituted amino group, nitro group, cyano group, said substituted or unsubstituted alkyl group, said substituted or unsubstituted alkenyl group excluding styryl group, said substituted or unsubstituted cycloalkyl group, said substituted or unsubstituted alkoxy group, said substituted or unsubstituted aromatic hydrocarbon group, said substituted or unsubstituted aromatic heterocyclic group, said substituted or unsubstituted aralkyl group, said substituted or unsubstituted aryloxy group, and said substituted or unsubstituted alkoxycarbonyl group and caroxyl.

Examples of the styryl group which Ar$^5$ or Ar$^6$ has as a substituent include a unsubstituted styryl group and 2,2-diphenylvinyl group as well as substituted styryl group and 2,2-diphenylvinyl group having substituent on the phenyl group. Examples of the substituent on phenyl group of styryl group and 2,2-diphenylvinyl group include a halogen atom, hydroxyl group, said substituted or unsubstituted amino group, nitro group, cyano group, said substituted or unsubstituted alkyl group, said substituted or unsubstituted alkenyl group, said substituted or unsubstituted cycloalkyl group, said substituted or unsubstituted alkoxy group, said substituted or unsubstituted aromatic hydrocarbon group, said substituted or unsubstituted aromatic heterocyclic group, said substituted or unsubstituted aralkyl group, said substituted or unsubstituted aryloxy group, and said substituted or unsubstituted alkoxycarbonyl group or carboxyl.

Examples of compounds to be used for the organic electroluminescent device of this invention include, although not limited to, the following formulas (12) to (48):

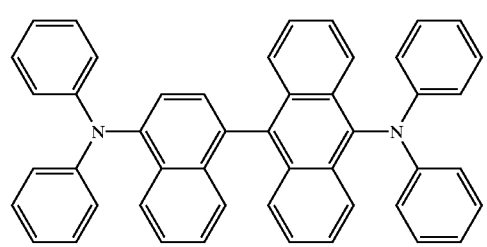

(12)

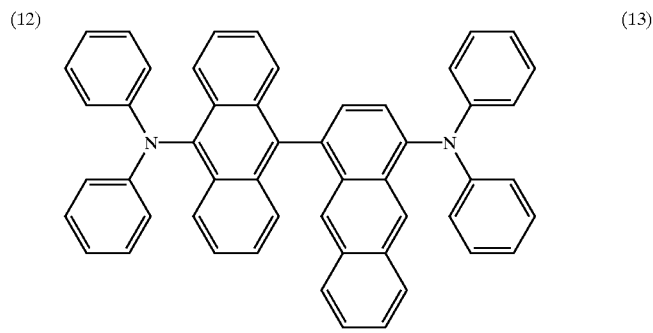

(13)

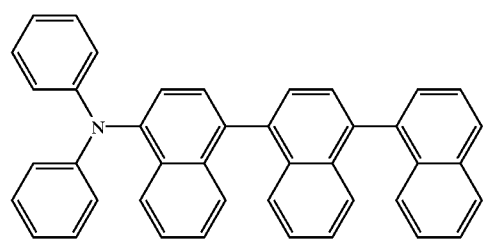

(14)

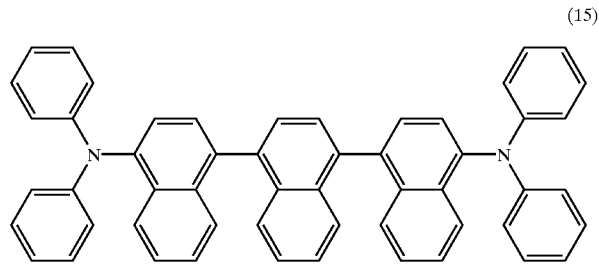

(15)

-continued
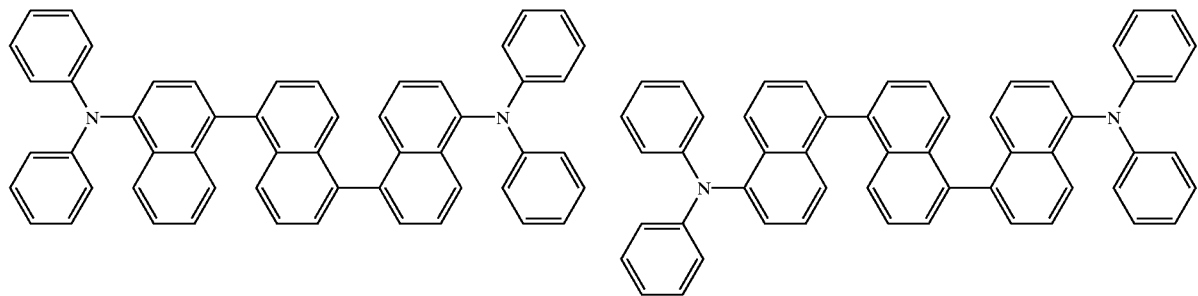
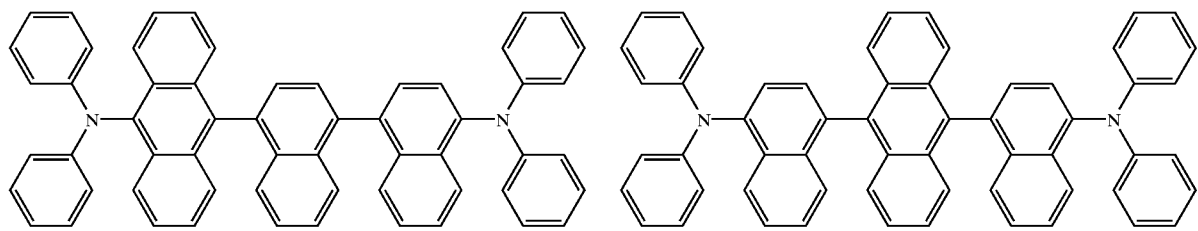
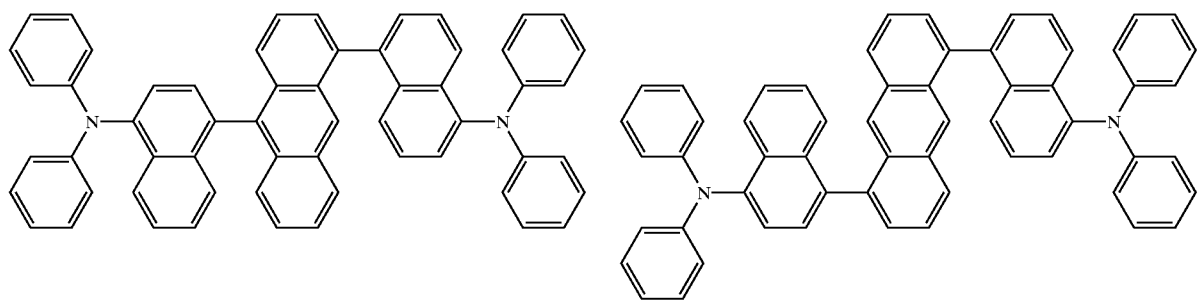
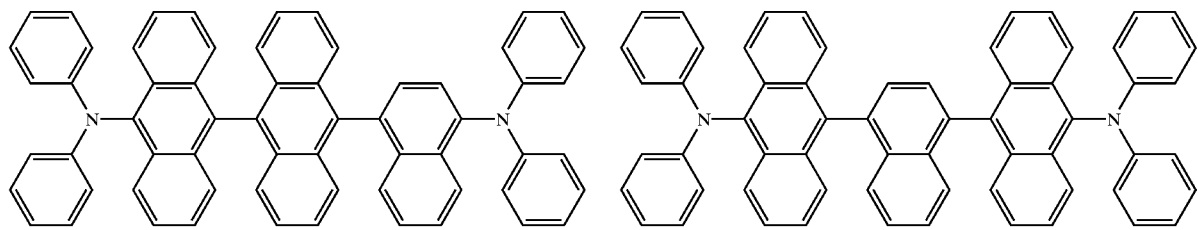
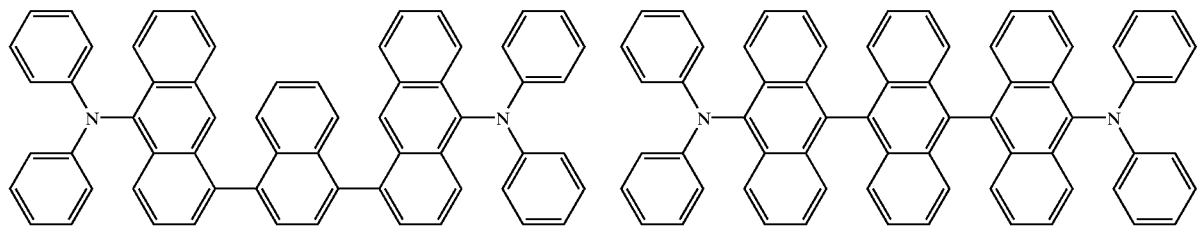

(26)
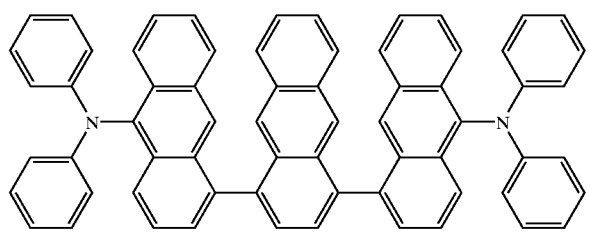
(27)
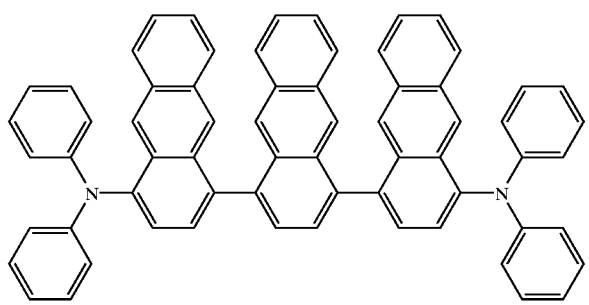
(28)
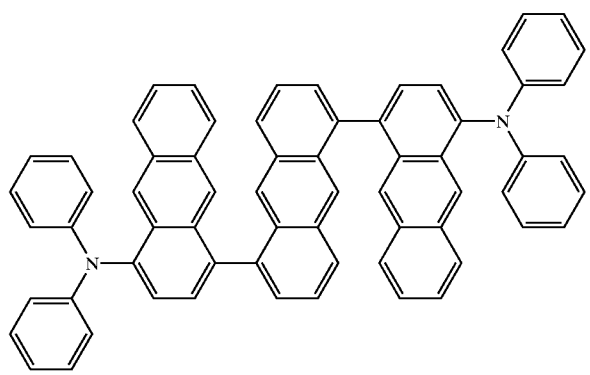
(29)
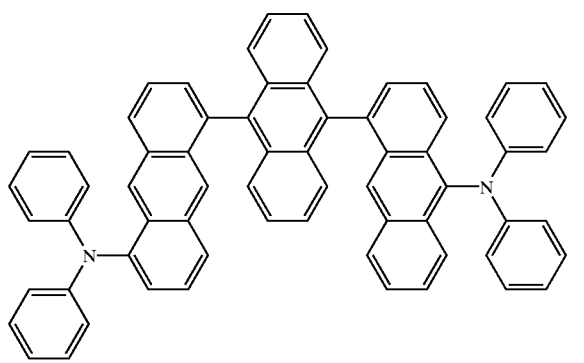
(30)
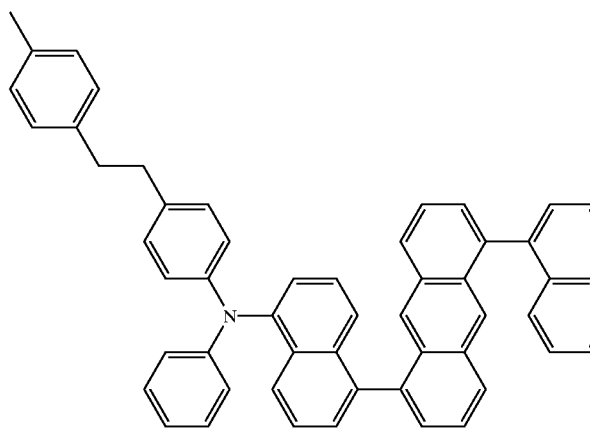
(31)
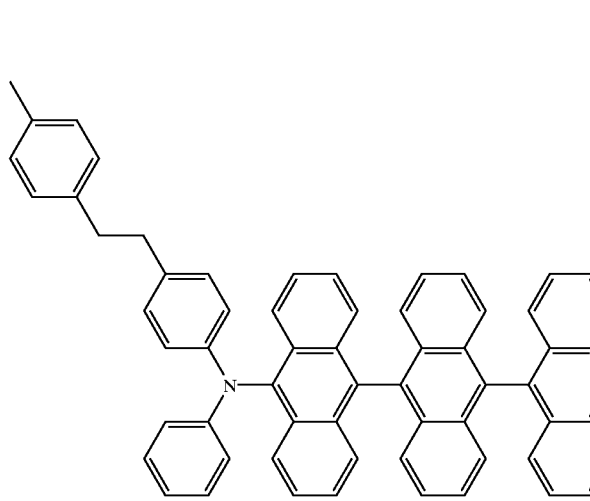

-continued
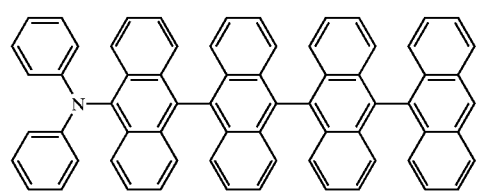
(32)
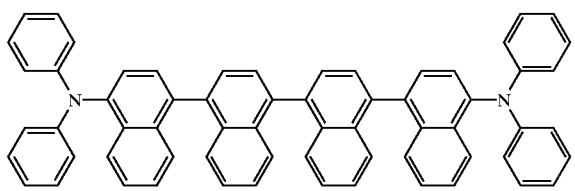
(33)
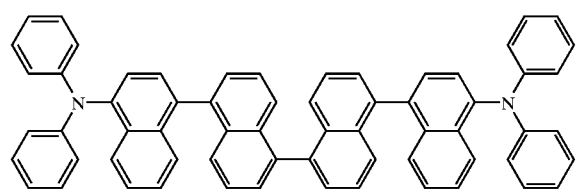
(34)
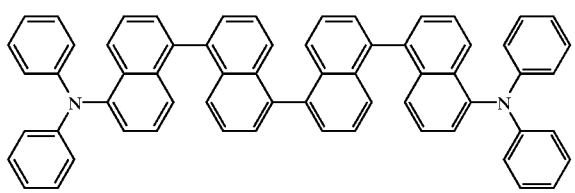
(35)
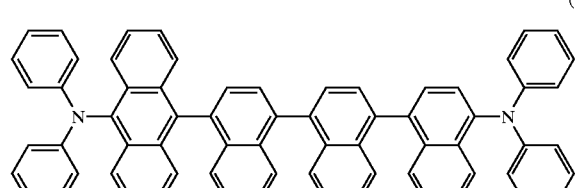
(36)
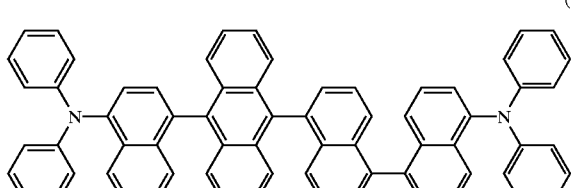
(37)
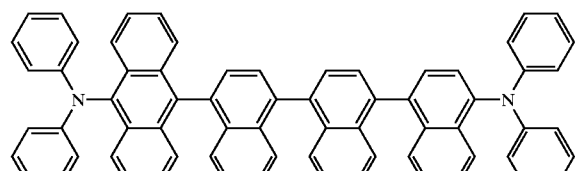
(38)
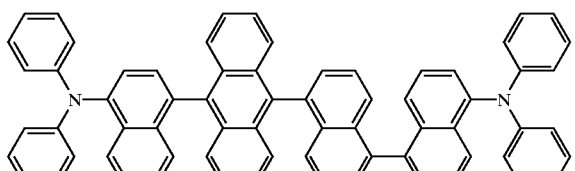
(39)
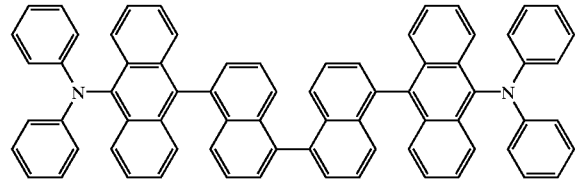
(40)
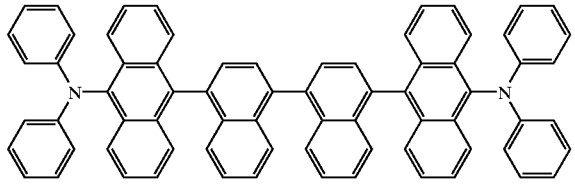
(41)
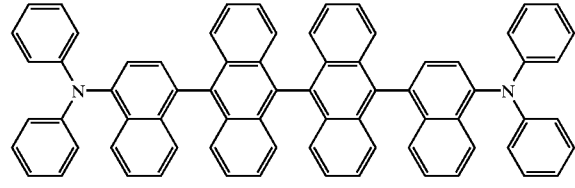
(42)
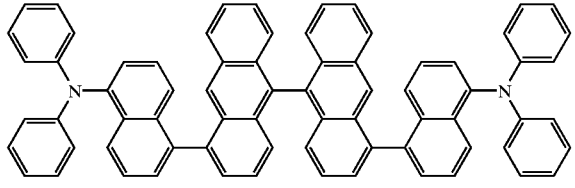
(43)
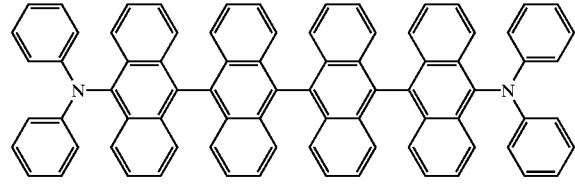
(44)
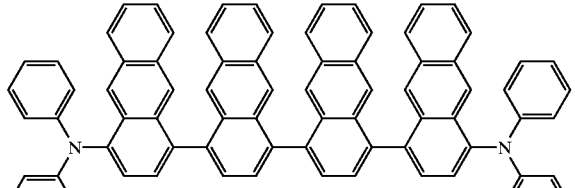
(45)
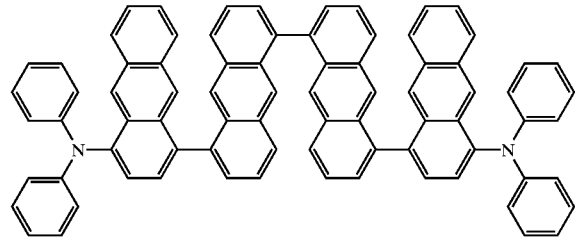
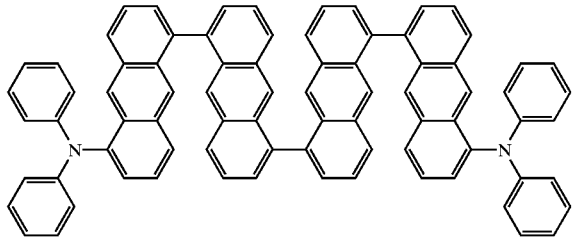

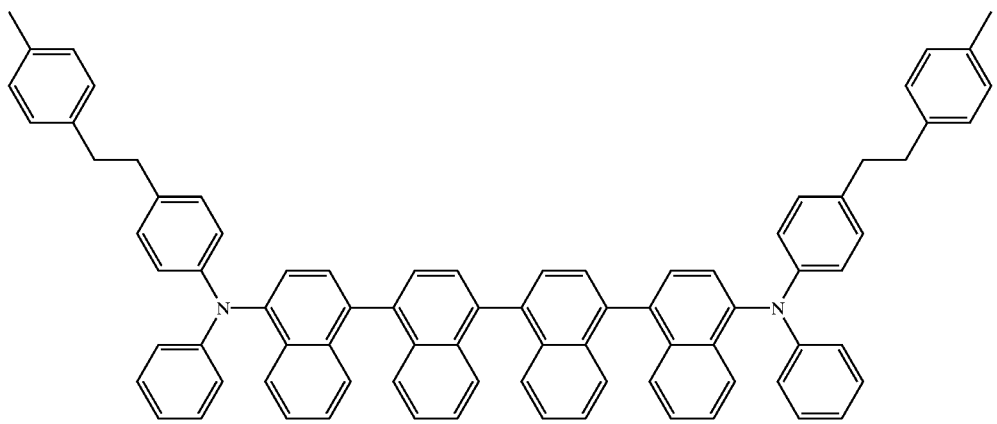

(46)

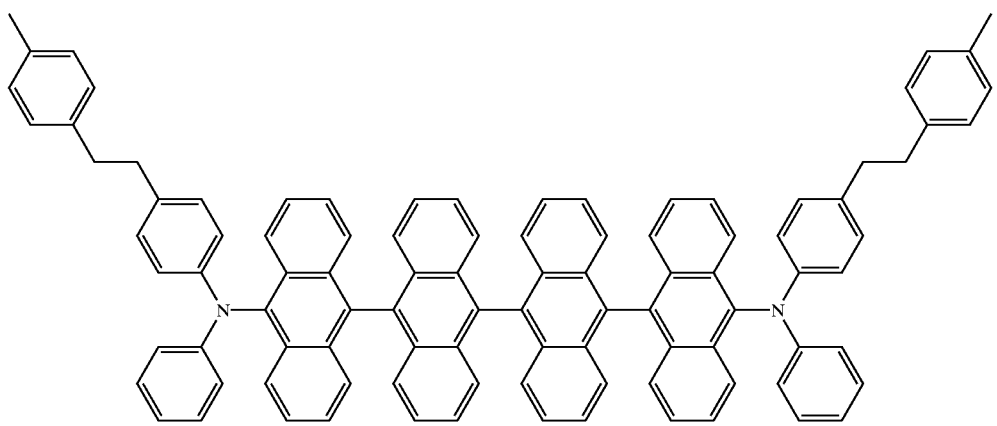

(47)

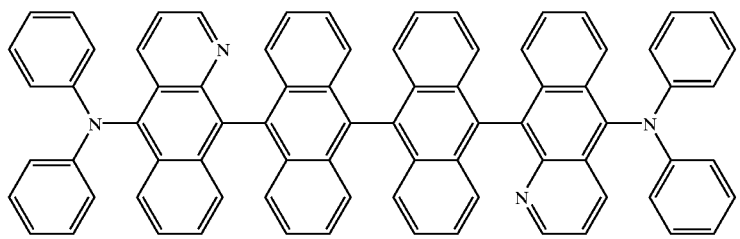

(48)

Figure 2:
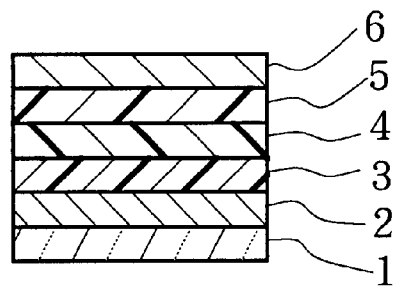
FIG. 2 is a sectional view of an organic EL device of this invention.
Figure 3:
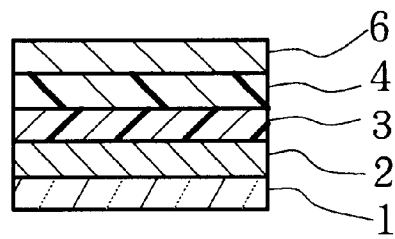
FIG. 3 is a sectional view of an organic EL device of this invention.
Figure 4:
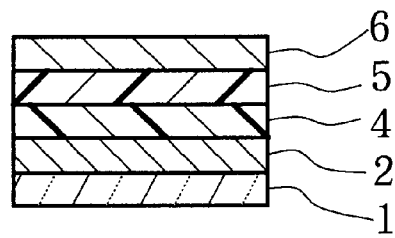
FIG. 4 is a sectional view of an organic EL device of this invention.

The organic EL device according to the present invention has a multi-layered structure having one or more than one organic thin-film layers including a light-emitting layer formed between electrodes. Examples include the structure as shown in FIG. 1 wherein an anode 2, light-emitting layer 4 and cathode 6 have been stacked one after another on a substrate 1; the structure as shown in FIG. 2 wherein an anode 2, hole-transporting layer 3, light-emitting layer 4, electron-transporting layer 5 and cathode 6 have been stacked one after another on a substrate 1; the structure as shown in FIG. 3 wherein an anode 2, hole-transporting layer 3, light-emitting layer 4 and cathode 6 have been stacked one after another on a substrate 1; and the structure as shown in FIG. 4 wherein an anode 2, light-emitting layer 4, electron-transporting layer 5 and cathode 6 have been stacked one after another on a substrate 1. The compound of formula (1) in the present invention may be used in any one of the above-described organic layers such as hole-transporting layer 3, light-emitting layer 4 or electron-transporting layer 5. A mixture of the compound and another hole-transporting material, light-emitting material or electron-transporting material can be also used.

There is no particular limitation imposed on the hole-transporting material usable in the present invention. Any compound employed as an ordinary hole-transporting material may be used. Examples include bis-triarylamines such as bis[di(p-tolyl)aminophenyl]-1,1-cyclohexane represented by the below-described formula (P1), N,N'-diphenyl-N,N'-bis(3-methylphenyl)-[1,1'-biphenyl]-4,4'-diamine represented by the below-described formula (P2) and N,N'-diphenyl-N-N-bis(1-naphthyl)-[1,1'-biphenyl]-4,4'-diamine represented by the below-described formula (P3) and compounds having starburst type structure represented by the below-described formulas (P4) to (P6):

(P1)

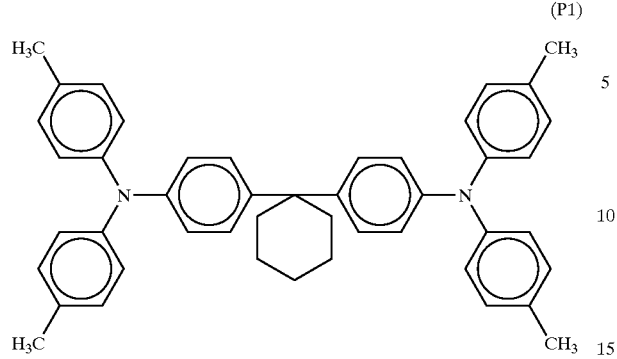

(P2)

(P3)

(P4)

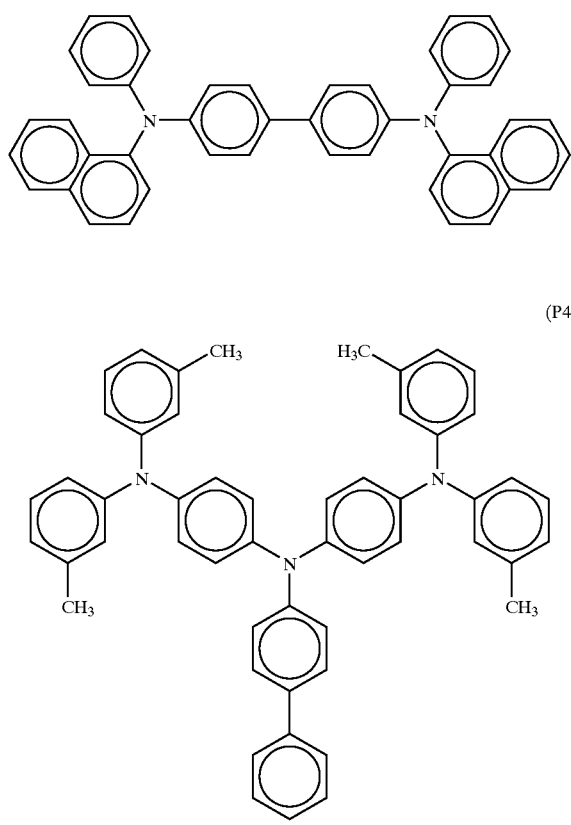

(P5)

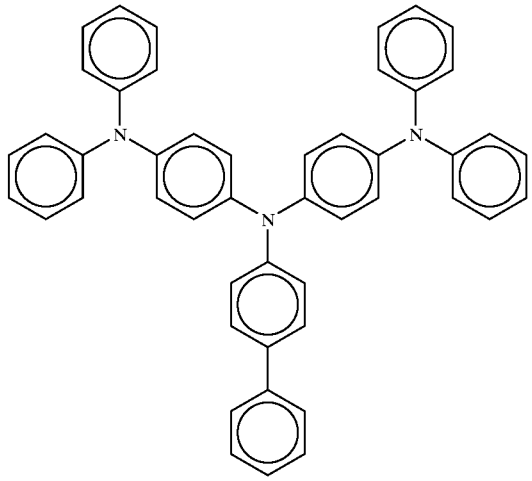

(P6)

There is no particular limitation imposed on the electron-transporting material usable in the present invention. Any material employed ordinarily as an electron-transporting material can be employed. Examples include oxadiazole derivatives such as 2-(4-biphenylyl)-5-(4-t-butylphenyl)-1,3,4-oxadiazole represented by the below-described formula (N1) and bis{2-(4-t-butylphenyl)-1,3,4-oxadiazole}-m-phenylene represented by the below-described formula(N2), triazole derivatives represented by the below-described formulas (N3) and (N4) and metal complex compounds of quinolinol derivatives represented by the below-described formulas (N5) to (N8):

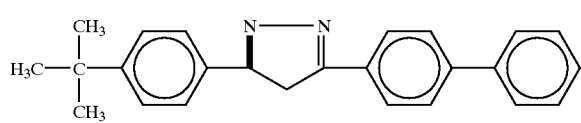
(N1)
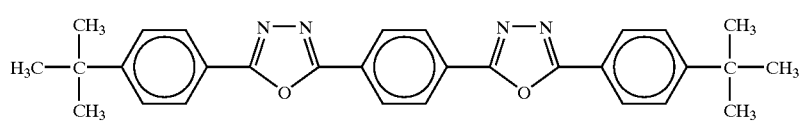
(N2)
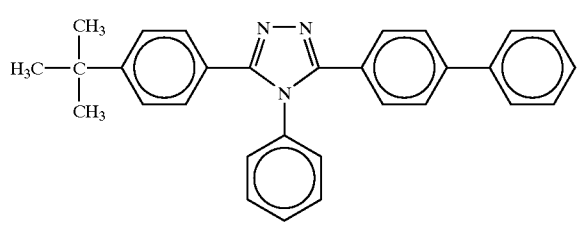
(N3)
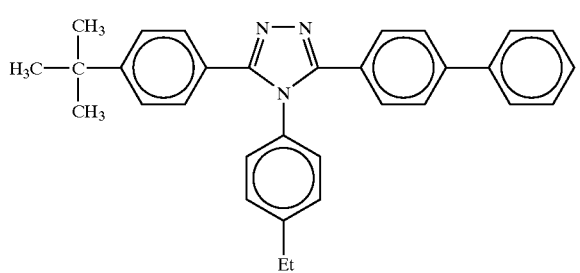
(N4)
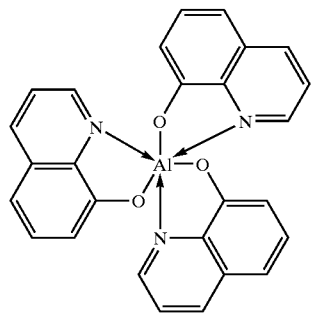
(N5)
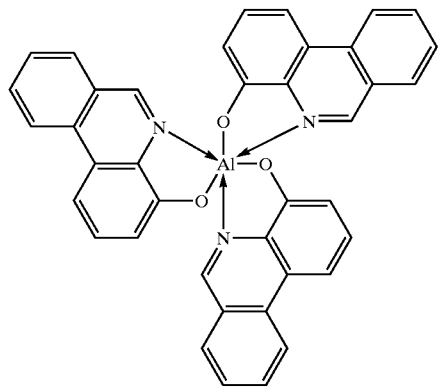
(N6)
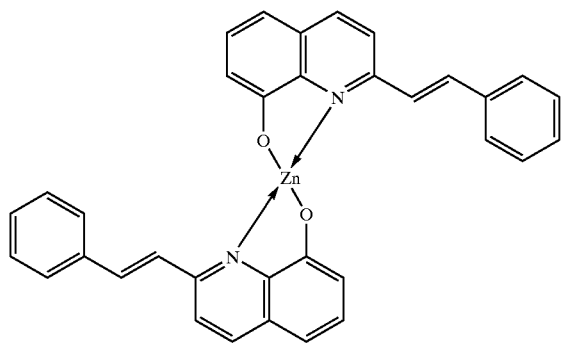
(N7)
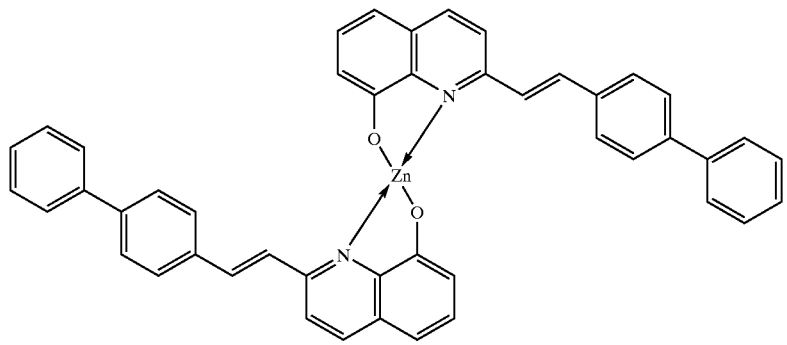
(N8)

The anode of the organic EL device injects holes into the hole-transporting layer and that having a work function of 4.5 eV or greater is effective. Specific examples of the anode material to be used for the organic EL device of the present invention include an indium tin oxide (ITO), tin oxide (NESA), gold, silver, platinum and copper.

For the injection of electrons into the electron-transporting layer or light-emitting layer, the cathode of the organic EL device having a smaller work function is preferred. Although there is no particular limitation imposed on the cathode material, specific examples include indium, aluminum, magnesium, magnesium-indium alloy, magnesium-aluminum alloy, aluminum-lithium alloy, aluminum-scandium-lithium alloy and magnesium-silver alloy.

Each layer of the organic EL device according to the present invention can be fabricated by any method. Conventionally known methods such as vacuum deposition and spin coating can be employed. The organic thin-film layer which is to be used in the organic EL device of the present invention and contains the compound of formula (1), (2) or (3) can be fabricated by a known method such as vacuum deposition, molecular beam epitaxy (MBE) or coating of a solution, which has been obtained by dissolving the compound or a mixture of the compound in a proper solvent, such as dipping, spin coating, casting, bar coating or roll coating. There is no particular limitation on the thickness of each organic layer of the organic EL device of the present invention. When the thickness of layer is too thin, defects such as pin holes tend to occur. When the thickness of layer is too thick, on the other hand, a high-applied voltage is required, which decreases the efficiency. Usually, the organic layers are therefore preferred to have a thickness within a range of several nm to 1 μm.

The present invention will hereinafter be described in detail with reference to examples, but it should however be borne in mind that the present invention is not limited only to the following examples unless the spirit or scope of the invention is changed.

SYNTHESIS EXAMPLE 1

Synthesis of Compound (18)

4-bromo-1,1'-binaphthyl and magnesium were refluxed in diethylether for one hour, which was then added to a solution of anthrone in tetrahydrofuran. The resulting mixture was heated for two hours, which was then poured into diluted hydrochloric acid. After being extracted by diethylether, organic layer was separated and dried over magnesium sulfate. It was purified according to conventional method, whereby 1-(9-anthryl)-4-(1-naphthyl)-naphthalene was obtained. This was dissolved in chloroform to which was added two equivalent amounts of N-bromosuccinimide, and they were stirred at room temperature for one day. The product was purified according to conventional method and 1-(10-bromo-9-anthryl)-4-(4-bromo-1-naphthyl)-naphthalene was obtained. With this pdoruct, diphenylamine was reacted in nitrobenzene at 180° C. for 40 hours together with potasium carbonate and copper powder. After nitrobenzene was removed by vacuum distillation, the reaction mixture was purified according to conventional method, whereby the target compound (18) was obtained.

SYNTHESIS EXAMPLE 2

Synthesis of Compound (25)

9-lithioanthracene which had been obtained from 9-bromoanthracene and lithium was react with anthraquinone, and the product was reductively aromatized by hydrogen iodide and phosphinicacid. This was purified according to conventional method and dissolved in chloroform. Two equivalents of N-bromosuccinimide were added to this solution and the mixture was stirred at room temperature for one day. The product was purified according to conventional method, whereby 9,10-bis(10'-bromo-9-anthryl)anthracene was obtained. This product, diphenylamine, potassium carbonate, copper powder and nitrobenze were heated at 180° C. for 40 hours with stirring. After nitrobenzene was removed by vacuum distillation, the reaction mixture was purified according to conventional method and target compound (25) was obtained.

SYNTHESIS EXAMPLE 3

Synthesis of Compound (31)

Phosphorus oxychloride was added to toluene solution of compound (25) and the mixture was stirred at room temperature. N-methylformanilide was added dropwise to this mixture. After addition, the mixture was stirred at 50° C. for five hours. After completion of reaction, the reaction mixture was slowly poured into cold water, and transferred to a separation funnel. The toluene layer was washed several times with water until it became neutral. After drying over magnesium sulfate and removal-of solvent, 10,10"-bis(N-p-formylphenyl-N-phenylamino)tri-9,10-anthrylene was obtained. Then, dimethylsulfoxide solution of 10,10"-bis(N-p-formylphenyl-N-phenylamino)tri-9,10-anthrylene was added dropwise to to a mixture of 4-methylbenzyl-diethylphosphonate, sodium hydride, and dimethylsulphoxide. The mixture was stirred at 50° C. for three hours. The reaction mixture was poured into ice water and neutralized with acid. The product was extracted with ethyl acetate and concentrated by vacuum evaporation. It was purified according to conventional method, whereby the target compound (31) was obtained.

SYNTHESIS EXAMPLE 4

Synthetic of Compound (32)

9-lithioanthracene which had been obtained from 9-bromoanthracene and lithium was react with bisanthron, and the product was reductively aromatized by hydrogen iodide and phosphinic acid. This was purified according to conventional method and dissolved in chloroform. One equivalent of N-bromosuccinimide was added to this solution and the mixture was stirred at room temperature for one day. The product was purified according to conventional method, whereby 10-bromo-tetra(9,10-anthrylene) was obtained. This product, diphenylamine, potassium carbonate, copper powder and nitrobenze were heated at 180° C. for 40 hours with stirring. After removal of nitrobenzene with vacuum distillation, the reaction mixture was purified according to conventional method and target compound (32) was obtained.

SYNTHESIS EXAMPLE 5

Synthesis of Compound (47)

In a similar manner to Synthesis Example 4 except for the use of two equivalents of N-bromosuccinimide, the compound (42) was obtained. And in a similar manner to Synthesis Example 3 except for the use of compound (42) instead of compound (25), the target compound (47) was obtained.

EXAMPLE 1

An organic EL device composed of three layers, that is, an anode, a light-emitting layer and a cathode as illustrated in the schematic cross-sectional view of FIG. 1 was fabricated. First, ITO was sputtered on glass substrate 1 to form a 120 nm thick film having a sheet resistance of 20 $\Omega/\square$ as anode 2. Over the anode, a 40 nm thick light-emitting layer 4 was formed by the vacuum deposition of Compound (18) synthesized in Synthesis Example 1. Then, a 200 nm thick cathode 6 was formed by the vacuum deposition of a magnesium-silver alloy, whereby the organic EL device was fabricated. When a dc voltage of 5 V was applied to the resulting device, light emission of 360 cd/m$^2$ was obtained.

EXAMPLE 2

In a similar manner to Example 1 except for the use of Compound (25) instead of Compound (18), an organic EL device was fabricated. When a dc voltage of 5V was applied to the resulting device, light emission of 300 cd/m$^2$ was obtained.

EXAMPLE 3

In a similar manner to Example 1 except for the use of Compound (31) instead of Compound (18), an organic EL device was fabricated. When a dc voltage of 5V was applied to the resulting device, light emission of 600 cd/m$^2$ was obtained.

EXAMPLE 4

In a similar manner to Example 1 except for the use of Compound (32) instead of Compound (18), an organic EL device was fabricated. When a dc voltage of 5V was applied to the resulting device, light emission of 390 cd/m$^2$ was obtained.

EXAMPLE 5

In a similar manner to Example 1 except for the use of Compound (47) instead of Compound (18), an organic EL device was fabricated. When a dc voltage of 5V was applied to the resulting device, light emission of 810 cd/m$^2$ was obtained.

EXAMPLE 6

An organic EL device which have the same structure as Example 1 was fabricated. First, ITO was sputtered on glass substrate 1 to form a 120 nm thick film having a sheet resistance of 20 $\Omega/\square$ as anode 2. Over the anode, a 40 nm thick light-emitting layer 4 was formed by the spin coating of a chloroform solution of Compound (31). Then, a 200 nm thick cathode 6 was formed by the vacuum deposition of a magnesium-silver alloy, whereby the organic EL device was fabricated. When a dc voltage of 5 V was applied to the resulting device, light emission of 210 cd/m$^2$ was obtained.

EXAMPLE 7

In a similar manner to Example 6 except for the use of Compound (47) instead of Compound (31), an organic EL device was fabricated. When a dc voltage of 5V was applied to the resulting device, light emission of 340 cd/m$^2$ was obtained.

EXAMPLE 8

An organic EL device composed of 5 layers, that is, an anode, a hole-transporting layer, a light-emitting layer, an electron-transporting layer and a cathode as illustrated in the schematic cross-sectional view of FIG. 2 was fabricated. First, ITO was sputtered on glass substrate 1 to form a 120 nm thick film having a sheet resistance of 20 $\Omega/\square$ as anode 2. Over the anode, a 50 nm thick hole-transporting layer 3 was formed by the vacuum deposition of the compound of formula (P4). Then, a 40 nm thick light-emitting layer 4 was formed by the vacuum deposition of Compound (25). A 50 nm thick electron-transporting layer 5 was formed by the vacuum deposition of the compound of formula (N5). Finally, a 200 nm thick cathode 6 was formed by the vacuum deposition of a magnesium-silver alloy, whereby the organic EL device of the present invention was fabricated. When a dc voltage of 10 V was applied to the resulting device, light emission of 3400 cd/m$^2$ was obtained.

EXAMPLE 9

In a similar manner to Example 8 except for the use of compounds of the formulas (P5), (31) and (N6) instead of compounds of formulas (P4), (25) and (N5) respectively, an organic EL device was fabricated. When a dc voltage of 10V was applied to the resulting device, light emission of 4500 cd/m$^2$ was obtained.

EXAMPLE 10

In a similar manner to Example 9 except for the use of Compound (18) instead of Compound (31), an organic EL device was fabricated. When a dc voltage of 10V was applied to the resulting device, light emission of 4300 cd/m$^2$ was obtained.

EXAMPLE 11

In a similar manner to Example 9 except for the use of Compound (32) instead of Compound (31), an organic EL device was fabricated. When a dc voltage of 10V was applied to the resulting device, light emission of 3800 cd/m$^2$ was obtained.

EXAMPLE 12

In a similar manner to Example 9 except for the use of Compound (47) instead of Compound (31), an organic EL device was fabricated. When a dc voltage of 10V was applied to the resulting device, light emission of 6000 cd/m$^2$ was obtained.

EXAMPLE 13

An organic EL device composed of 4 layers, that is, an anode, a light-emitting layer, an electron-transporting layer and a cathode as illustrated in the schematic cross-sectional view of FIG. 4 was fabricated. First, ITO was sputtered on glass substrate 1 to form a 120 nm thick film having a sheet resistance of 20 $\Omega/\square$ as the anode 2. Over the anode, a 50 nm thick light-emitting layer 4 was formed by the vacuum co-deposition of the compound of formula (P3) and Compound (25) at a weight ratio of 1:10. A 50 nm thick electron-transporting layer 5 was formed by the vacuum deposition of the compound of formula (N3). Finally, a 200 nm thick cathode 6 was formed by the vacuum deposition of a magnesium-silver alloy, whereby the organic EL device of the present invention was fabricated. When a dc voltage of 10 V was applied to the resulting device, blue light emission of 2300 cd/m$^2$ was obtained.

EXAMPLE 14

In a similar manner to Example 13 except for the use of Compound (47) instead of Compound (25), an organic EL device was fabricated. When a dc voltage of 10V was applied to the resulting device, light emission of 4500 cd/m² was obtained.

EXAMPLE 15

ITO was sputtered on glass substrate 1 to form a film having a sheet resistance of 20 Ω/□ as the anode 2. Over the anode, a 50 nm thick light-emitting layer 4 was formed by the spin coating of the chloroform solution of compounds of formula (P3) and (25) at a weight ratio of 1:10. A 50 nm thick electron-transporting layer 5 was formed by the vacuum deposition of the compound of formula (N4). Finally, a 200 nm thick cathode 6 as formed by the vacuum deposition of a magnesium-silver alloy, whereby the organic L device of the present invention was fabricated. When a dc voltage of 10 V was applied o the resulting device, blue light emission of 900 cd/m² was obtained.

EXAMPLE 16

An organic EL device composed of 4 layers, that is, an anode, a hole-transporting layer, a light-emitting layer and a cathode as illustrated in the schematic cross-sectional view of FIG. 3 was fabricated. First, ITO was sputtered on a glass substrate 1 to form a 120 nm thick film having a sheet resistance of 20 Ω/□ as anode 2. Over the anode, a 50 nm thick hole-transporting layer 3 was formed by the vacuum deposition of the compound of formula (P3). A 50 nm thick light-emitting layer 4 was then formed by the vacuum co-deposition of the compound of formula (N5) and Compound (25) at a weight ratio of 20:1. Finally, a 200 nm thick cathode 6 was formed by the vacuum deposition of a magnesium-silver alloy, whereby the organic EL device of the present invention was fabricated. When a dc voltage of 10 V was applied to the resulting device, light emission of 1800 cd/m² was obtained.

EXAMPLE 17

In a similar manner to Example 16 except for the use of compounds of the formulas (P2), (N7) and (31) instead of compounds of formulas (P3), (N5) and (25) respectively, an organic EL device was fabricated. When a dc voltage of 10V was applied to the resulting device, light emission of 2300 cd/m² was obtained.

EXAMPLE 18

In a similar manner to Example 8 except for the use of Compound (25) instead of compound of the formula (P4) and the use of the compound of formula (N7) instead of Compound (25), an organic EL device was fabricated. When a dc voltage of 10V was applied to the resulting device, light emission of 1300 cd/m² was obtained.

EXAMPLE 19

In a similar manner to Example 18 except for the use of Compound (31) instead of Compound (25), an organic EL device was fabricated. When a dc voltage of 10V was applied to the resulting device, light emission of 1800 cd/m² was obtained.

EXAMPLE 20

In a similar manner to Example 18 except for the use of Compound (47) instead of Compound (25), an organic EL device was fabricated. When a dc voltage of 10V was applied to the resulting device, light emission of 2900 cd/m² was obtained.

Since the above embodiments are described only for examples, the present invention is not limited to the above embodiments and various modifications or alterations can be easily made therefrom by those skilled in the art without departing from the scope of the present invention.

What is claimed is:

1. An organic EL device comprising an anode, a cathode and one or more than one organic thin-film layers including a light-emitting layer between said anode and said cathode, wherein at least one of said organic thin-film layers contains, either singly or as a mixture, a compound represented by one of the following formulas (1), (2) or (3):

where $Ar^1$, $Ar^{1\prime}$ and $Ar^2$ each independently represents a group represented by one of the following formulas (4), (5) and (6), and wherein $Ar^1$ and $Ar^{1\prime}$ are different from each other:

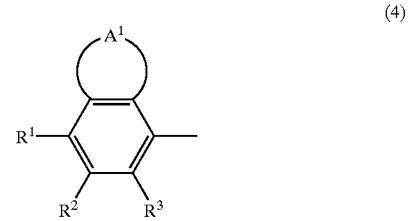

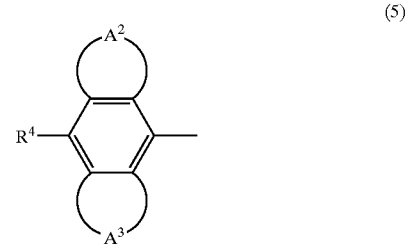

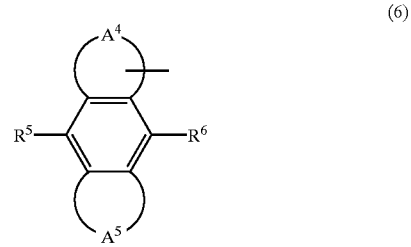

and wherein $Ar^3$ and $Ar^4$ each independently represents a divalent group represented by one of the following formulas (7) to (11),

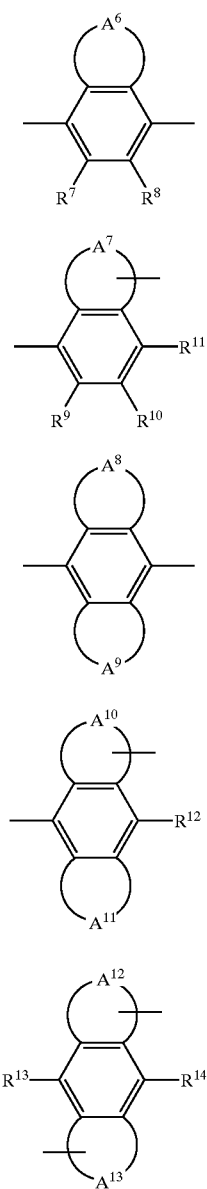

where $R^1$–$R^{14}$ represent each independently a hydrogen atom, a halogen atom, a nitro group, a cyano group, a substituted or unsubstituted alkyl group, a substituted or unsubstituted alkenyl group excluding a substituted or unsubstituted styryl group, a substituted or unsubstituted aromatic hydrocarbon group, a substituted or unsubstituted aromatic heterocyclic group, a substituted or unsubstituted amino group, a substituted or unsubstituted alkoxy group, a substituted or unsubstituted aryloxy group, a substituted or unsubstituted alkoxycarbonyl group or a carboxyl group; and each pair of two of $R^1$ to $R^3$, $R^5$–$R^6$, $R^7$–$R^8$, $R^9$–$R^{10}$, and $R^{13}$–$R^{14}$ may form a ring, $A^1$ to $A^{13}$ represent an atomic group forming a substituted or unsubstituted condensed hydrocarbon ring, wherein when $Ar^2$ is represented by formula (4) or (6), $A^1$ forms a substituted or unsubstituted 1-naphthyl group and $A^4$ and $A^5$ form a substituted or unsubstituted 1-anthryl group or a substituted or unsubstituted 2-anthryl group, and wherein at least one of the substituent groups $R^1$ to $R^{14}$ or ones existing in the ring structures represented by $A^1$ to $A^{13}$ is a diarylamino group represented by the formula —$NAr^5Ar^6$, wherein $Ar^5$ and $Ar^6$ each independently represents a substituted or unsubstituted aryl group having 6–20 carbon atoms.

2. An organic electroluminescent device as defined in claim 1, wherein the organic thin-film layer includes at least a light-emitting layer which contains, either singly or as a mixture, a said compound.

3. An organic electroluminescent device as defined in claim 1, wherein said organic thin-film layers comprise, in addition to said light-emitting layer, at least a one hole-transporting layer which contains, either singly or as a mixture, said compound.

4. An organic electroluminescent device as defined in claim 1, wherein said organic thin-film layers comprise, in addition to said light-emitting layer, at least one electron-transporting layer which contains, either singly or as a mixture, said compound.

5. An organic electroluminescent device as defined in claim 1 to 4, wherein the compound is such that at least one of $Ar^5$ and $Ar^6$ has a substituted or unsubstituted styryl group as a substituent group.

* * * * *